United States Patent
Xue

(10) Patent No.: US 9,998,698 B1
(45) Date of Patent: Jun. 12, 2018

(54) CIRCUITRY AND METHOD FOR READOUT OF HYBRID-BONDED IMAGE SENSORS

(71) Applicant: OmniVision Technologies, Inc., Santa Clara, CA (US)

(72) Inventor: Song Xue, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days. days.

(21) Appl. No.: 15/421,807

(22) Filed: Feb. 1, 2017

(51) Int. Cl.
| | |
|---|---|
| *H04N 5/374* | (2011.01) |
| *H01L 27/146* | (2006.01) |
| *H04N 5/3745* | (2011.01) |
| *H04N 5/243* | (2006.01) |
| *H04N 5/357* | (2011.01) |

(52) U.S. Cl.
CPC ....... *H04N 5/3741* (2013.01); *H01L 27/1464* (2013.01); *H01L 27/14612* (2013.01); *H01L 27/14634* (2013.01); *H01L 27/14643* (2013.01); *H04N 5/243* (2013.01); *H04N 5/3575* (2013.01); *H04N 5/37455* (2013.01); *H04N 5/37457* (2013.01)

(58) Field of Classification Search
CPC .... H04N 5/3741; H04N 5/3575; H04N 5/243; H04N 5/37457; H04N 5/37455; H01L 27/14612; H01L 27/14643; H01L 27/14634; H01L 27/1464
See application file for complete search history.

(56) References Cited

U.S. PATENT DOCUMENTS

| | | | |
|---|---|---|---|
| 6,504,141 B1 | 1/2003 | Kozlowski et al. | |
| 6,902,987 B1 | 6/2005 | Tong et al. | |
| 7,230,479 B2 * | 6/2007 | Forbes | H03F 1/26 330/9 |
| 8,405,747 B2 * | 3/2013 | Mo | H04N 5/378 348/245 |
| 8,773,562 B1 * | 7/2014 | Fan | H01L 27/14643 348/308 |

(Continued)

OTHER PUBLICATIONS

Chen et al. (2009) "An Efficient BScan-Sample-Based ΣΔ Beamformer for Medical Ultrasound Imaging," IEEE Biomedical Circuits and Systems Cont. 285-288.

(Continued)

*Primary Examiner* — Padma Haliyur
(74) *Attorney, Agent, or Firm* — Lathrop Gage LLP

(57) ABSTRACT

A hybrid bonded image sensor has a photodiode die with macrocells having at least one photodiode and a bond contact; a supporting circuitry die with multiple supercells, each supercell having at least one macrocell unit bonded to the bond contact of a macrocell of the photodiode die. Each macrocell unit has a reset transistor adapted to reset photodiodes of the photodiode die macrocell. Each supercell has a differential amplifier configurable to receive a noninverting input from a photodiode and an inverting input, the differential amplifier providing an output, each differential amplifier has an amplifier reset transistor coupled to the differential amplifier output and the inverting input; a first capacitor coupled between the differential amplifier output and the inverting input, and a second capacitor coupled between the inverting input and a signal ground. The first and second capacitor of embodiments has controllable capacitance to adjust gain.

15 Claims, 9 Drawing Sheets

(56) References Cited

U.S. PATENT DOCUMENTS 9,064,769 B2 6/2015 Kozlowski
2017/0170223 A1* 6/2017 Hynecek ........... H01L 27/14634

OTHER PUBLICATIONS

Xu "High-Speed Highly Sensitive CMOS Image Sensors," Ph.D. Thesis Defense, Hong Kong University of Science and Technology. 1-152.

Xu et al. (Oct. 2014) "A 1/2.5-inch VGA 400-fps CMOS Image Sensor with High Sensitivity," IEEE J. Solid-State Circuits. 49(1):2342-2351.

Xu et al. (Jun. 2012) "A 1500 fps Highly Sensitive 256x256 CMOS Imaging Sensor with In-Pixel Calibration," IEEE J. Solid-State Circuits. 47(6):1408-1418.

Xu et al. (2009) "Characterization and Analysis of Intra-Body Communication Channel," Int. Symp. Antennas and Propagation Soc. 1-4.

Xu et al. (2009) "Circuit-Coupled FEM Analysis of the Electric-Field Type Intra-Body Communication Channel," IEEE Biomedical Circuits and Systems Cont. 221-224.

Xu et al. (Sep. 2012) "Digitally Calibrated 768kS/s 1 0-bit Minimum-size SAR ADC Array with Dithering," IEEE J. Solid-State Circuits. 47(9):2129-2140.

Xu et al. (Mar. 2011) "Electric-Field Intrabody Communication Channel Modeling with Finite Element Method," IEEE Trans. Biomed. Eng. 58(3):705-712.

Xu et al. (Jul. 2012) "Equation Environment Coupling and Interference on the Electric-Field Intrabody Communication channel," IEEE Trans. Biomed. Eng. 59(7):2051-2059.

Yuan et al. (Jan. 2012) "An Interpolation-Based Calibration Architecture for Pipeline ADC with Nonlinear Error," IEEE Trans. Instrum. Meas. 61(1):17-25.

Yuan et al. (Mar. 2012) "A 12-bit 20MS/s 56.3mW pipelined ADC with interpolation-based nonlinear calibration," IEEE Trans. Circuits Syst. I, Reg. Papers. 59(3):555-565.

Zhu et al. (2009) "High Speed Intra-Body Communication for Personal Health Care," IEEE Int. Cont. Eng. Med. Biol. Soc. 709-712.

* cited by examiner

| Reset Photodiodes 902 |
|---|
| Expose Photodiodes 904 |
| Configure Differential Amplifier Gain 906 |
| Reset Differential Amplifier 908 |
| Take First Sample in CDS embodiments 909 |
| Select Photodiode for Read and Couple Signal Through Bond to Macrocell Unit of Supercell on Supporting Circuitry Die 910 |
| Allow Amplifier to Settle 912 |
| Read Amplifier to Bit Line 914 |
| Sample bit line 916 (second sample in CDS) |
| Subtract First Sample from Second Sample in CDS 918 |
| Digitize Sample in ADC 920 |

Fig. 9

CIRCUITRY AND METHOD FOR READOUT OF HYBRID-BONDED IMAGE SENSORS

BACKGROUND

CMOS rectangular-array photosensor arrays are commonly used as image sensors in cameras. These arrays have an array of N by M (when N and M are both greater than 1 and often are unequal) photodiode-based photosensors each having at least one selection transistor having a gate coupled to a transfer and selection line. These arrays typically have reset transistors arranged so to provide a charge cleanup function to the photodiode, and one or more transfer gate transistors and a source follower transistor arranged to read post-exposure charge from the photodiode onto one or more bit lines; these arrays typically also have decoder-drivers configured to drive the transfer and selection lines and gain amplifiers fed by the bit lines, and in some embodiments may incorporate other circuitry.

SUMMARY

In an embodiment, a hybrid bonded image sensor has a photodiode die with macrocells having at least one photodiode and a connection point; a supporting circuitry die with multiple supercells, each supercell having at least one macrocell unit with a connection point electrically connected to the connection point of a macrocell of the photodiode die, the electrical connection referred to as a bond. Each macrocell unit has a precharge or reset transistor adapted to precharge photodiodes of the macrocell of the photodiode die. A differential amplifier is directly applied onto the sense node, shared as a supercell. Each supercell has a differential amplifier configurable to receive a noninverting input from a photodiode and an inverting input, the differential amplifier providing an output, each differential amplifier has an amplifier reset transistor coupled to the differential amplifier output and the inverting input; a first capacitor coupled between the differential amplifier output and the inverting input, and a second capacitor coupled between the inverting input and a signal ground. Although the second capacitor of particular embodiments is shown as having controllable capacitance in FIG. 2, both capacitors can be arranged as adjustable capacitors so as to provide desired system gain.

In another embodiment, a method of forming digitized pixel data using a photodiode die includes resetting a photodiode of the photodiode die, exposing the photodiode to light, coupling a signal from the photodiode of the photodiode die through a bond to a macrocell circuit of a supporting circuitry die, the macrocell circuit with at least a noninverting input transistor of a differential amplifier. The method includes configuring a gain of the differential amplifier by setting a capacitance of an selectable-capacitance gain control circuit, and resetting the amplifier, then amplifying, using the differential amplifier, the signal from the photodiode of the photodiode die, before coupling a signal from the differential amplifier to an analog-to-digital converter; and forming digitized pixel data by steps comprising digitizing the signal in the analog-to-digital convertor.

BRIEF DESCRIPTION OF THE FIGURES

FIG. 9 is a flowchart illustrating operation of the image sensor of FIG. 3 or FIG. 4.

DETAILED DESCRIPTION OF THE EMBODIMENTS

Typical CMOS image sensors have the precharge and selection transistors, decoder-drivers, gain amplifiers, and photodiodes all fabricated in the same monolithic integrated circuit substrate. This necessarily requires reserving some active area near each photodiode for the transistors, as well as associated interconnect such as the selection and sense signal lines. As cameras become smaller, to fit in thin devices like cell phones, and the market demands larger pixel counts, less and less surface area is allowed for each photodiode. Since signal levels depend on photons received by each photodiode, it is desirable to maximize the proportion of image-sensor area devoted to the photodiodes to maintain sensitivity.

Silicon is the semiconductor material most commonly used for CMOS electronic circuitry. While other semiconductor materials give improved sensitivity at specific wavelengths, it can be difficult to design and fabricate decoders, gain amplifiers, and other circuitry in those materials. For example, photodiodes fabricated of gallium arsenide (GaAs), gallium indium phosphide (GaInP), indium gallium arsenide (InGaAs) and germanium (Ge) may respond to wavelengths longer than those wavelengths of light silicon photodiodes typically respond to. Image sensors responsive to long wavelength, infrared, light may be useful in military and security systems.

Figure 1:
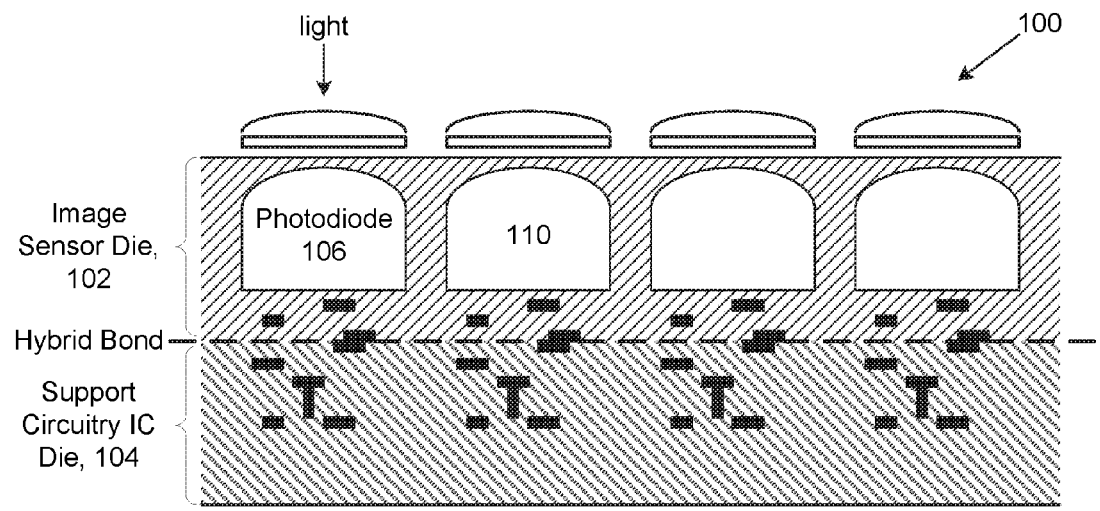
FIG. 1 is a partial cross sectional diagram of a hybrid bonded image sensor.

An image sensor 100 (FIG. 1) is built from two separately-fabricated integrated circuit die bonded together to form a structure having two active layers, a photodiode layer 102 fabricated from silicon or from another semiconductor material, such as germanium, gallium arsenide, indium gallium arsenide, gallium nitride, mercury telluride, or indium phosphide, selected according to the wavelengths for which the image sensor is intended for use, and a supporting circuitry layer 104 fabricated in a monolithic silicon CMOS process. The supporting circuitry layer includes gain amplifiers, multiplexors, and similar circuits and, in some embodiments, analog to digital conversion and digital image processing circuitry as well.

Hybrid stack is a new technology for a cross Silicon wafer surface to surface bonding technology. It is a Silicon surface level micro-bonding technology, which enables small pitch pixel level inter-chip bonding connection and may also be used in some other embodiments.

The pixel level hybrid bond architecture, with photodiodes on a different die than the die having supporting circuitry, not only permits using a greater percentage of photodiode-die area for photodiodes, but permits optimizing processing and materials of the photodiode die for photodiodes, while optimizing processing of the supporting circuitry die for the supporting CMOS circuitry.

In an alternative embodiment, a similar multilayer structure is formed by depositing a second semiconductor layer over integrated circuitry formed in a first integrated circuit die, the first integrated circuit die having the supporting circuitry, and the photodiodes formed in the second semiconductor layer.

Pixel-Level Bond Concept

In either embodiment, an electrical contact is made between a macrocell having a small group of photodiodes 106, 110 within the photodiode die from interconnect of the active layer or integrated circuit die in which the photodiode is fabricated (hereinafter the photodiode die) to interconnect of the integrated circuit die 104 of the supporting circuitry (hereinafter the support circuitry die) die wherein more decoding, amplification, read selection, and gain amplification circuitry lies. Photodiode die macrocells typically have two, four, or eight photodiodes. In embodiments, such as the embodiment of FIG. 1, formed of two separately-fabricated integrated circuit die, the contacts are formed by implementing a cross wafer hybrid bond technology to couple these interconnects.

For purposes of this document, a pixel-level bond image sensor has one or more bonds for every macrocell having two, four, eight, or sixteen photodiodes. In a particular embodiment, the bond-per-pixel image sensor has a bond for every macrocell having four photodiodes. Further, in a particular embodiment, the photodiode die is a backside-illuminated photodiode die.

Figure 2:
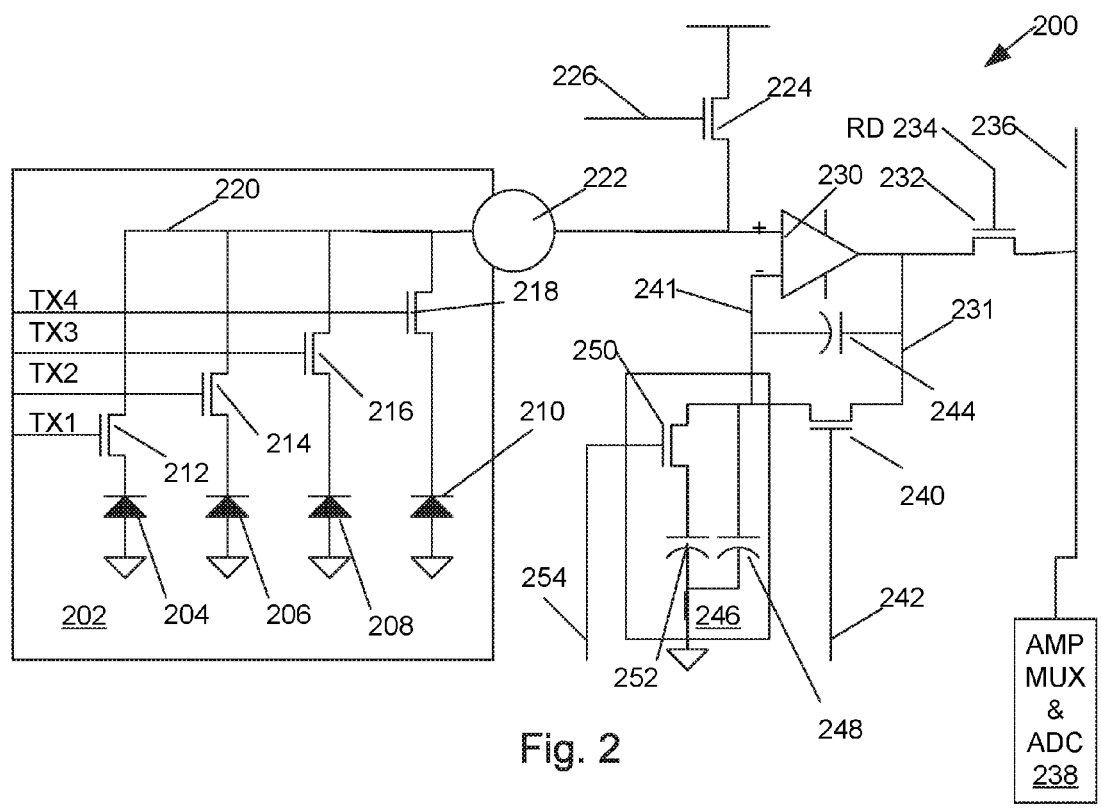
FIG. 2 is a schematic diagram of a macrocell in an embodiment, showing the inter-die bond and cascade gain amplification circuitry.

FIG. 2, Basic Adjustable-Gain Amplifier

In an embodiment, a macrocell 200 has a photodiode macrocell 202 with four photodiodes, 204, 206, 208, and 210. Alternative embodiments have other numbers of photodiodes per macrocell, such as 2, 4, or 8 photodiodes per macrocell. Each photodiode 204, 206, 208, 210 is coupled through a transfer gate or selection transistor 212, 214, 216, 218 respectively, to a macrocell data line 220, the selection (transfer gate) transistors 212, 214, 216, 218 are controlled by select and transfer lines TX1, TX2, TX3, and TX4 respectively. Macrocell data line 220 is coupled from the photodiode die to the support circuitry by a bond 222, in the support circuitry die macrocell data line 220 couples to a macrocell precharge device 224 controlled by a reset line 226; in operation a transfer and selection transistor of transistors 212-218 is enabled by a photodiode select line TX1-4 while precharge device 224 is activated by reset line 226 to couple a selected photodiode of photodiodes 204-210 to a "black" voltage level, draining out accumulated photocurrent charge from a given photodiode of photodiodes 204-210 during a reset phase. In a particular embodiment, the selection transistors are sequentially activated to reset the photodiodes. In an alternative embodiment, all four selection transistors of a macrocell may be enabled simultaneously by driving photodiode select lines TX1-TX4 high to reset all four photodiodes 204-210. Once reset, the selection transistors and precharge transistor are then disabled and light is permitted to generate photocurrent and accumulate charge in the photodiodes 204-210 for an exposure time.

Unlike the traditional image sensor, where the macrocell data line 220 couples to a source follower device as a signal buffer, the data line 220 is directly coupled to a non-inverting input node of an amplifier 230, amplifier 230 has output 231 coupled through a select transistor 232 controlled by a select line 234 to a signal bus line 236. Signal bus line 236 couples to additional amplifiers, multiplexors, and analog-to-digital converter (AMP-MUX-ADC) 238 to provide a serialized image data output from the image sensor.

Amplifier 230 output 231 couples to an inverting input 241 of amplifier 230 through an amplifier reset device 240 controlled by an amplifier reset line 242; amplifier reset device 240 is coupled in parallel with a gain-controlling capacitor 244. The inverting input 241 of amplifier 230 is also coupled through a variable-capacitor gain-adjustment assembly 246 to ground. Variable-capacitor gain-adjustment assembly 246 includes a fixed capacitor 248 and one or more capacitance-selection transistors 250, each of which is coupled in series with a gain-adjustment capacitor 252 and controlled by a gain-adjustment control line 254. In alternative embodiments, gain controlling capacitor 244 is adjustable through gain adjustment control lines that use transmission gate transistors to couple one or more selected capacitors between inverting input 241 and output 232.

During operation, after photodiodes 204-210 have been reset and exposed to light for the exposure time, and reset device 224 disabled, amplifier reset device 240 is activated to reset amplifier 230. Gain-adjustment control lines 254 are set to an appropriate gain, amplifier reset device 240 is turned off and a photodiode select line of photodiode select lines TX1-4 is activated while select transistor 232 is turned on. An image-dependent voltage on the selected photodiode of photodiodes 204-210 is then amplified in amplifier 230 by a gain dependent on the gain-adjustment control lines 254, the amplified image-dependent voltage provided to AMP-MUX & ADC 238 where it is digitized for further processing. The selected photodiode is deselected, and further photodiodes of macrocell 202 are read by resetting amplifier 230 by pulsing reset line 242, selecting the photodiode with a select line of select lines TX1-4, amplifying photodiode voltage, and sending amplified photodiode voltage to AMP-MUX & ADC 238 as previously described.

Though the readout circuitry can be placed on the second die with the help from the hybrid stack technology, still only limited space is available for circuitry implementation under small pixel pitch sensor required by many applications. To construct and implement the described amplifier system in the pixel level is normally impossible. This invention illustrated a new architecture for making this implementation possible. This goal is achieved by introducing an unique system architecture. Such a system implementation can be summarized with following three items:

(1) Conventional image sensors use source-followers as buffers to support active pixel readout. In this embodiment, the source follower in the traditional image pixel circuits is replaced by a high-gain differential-amplification system, which provides high system conversion gain and suppresses downstream noise (2) Only a small portion of the differential amplifier (in one example, 4 devices) is arranged in the cluster pitch as an array element, which enables the high gain amplifier system to be constructed at pixel level and support compact sensor designs (3) A majority of devices in the buffer are outside of the array core and shared among at least the photosensors of the macrocell, enabling sufficient circuitry to ensure high performance analog signal processing.

Assuming open-loop gain of amplifier 230 is sufficiently large, closed loop gain of amplifier 230 is approximately 1+Cvar/Cfb, where Cvar is capacitance of the variable capacitor gain-adjustment assembly 246, and Cfb is capacitance of fixed capacitor 244. In an alternative embodiment, feedback capacitor 244 has configurable capacitance and is useable to adjust gain.

Figure 3:
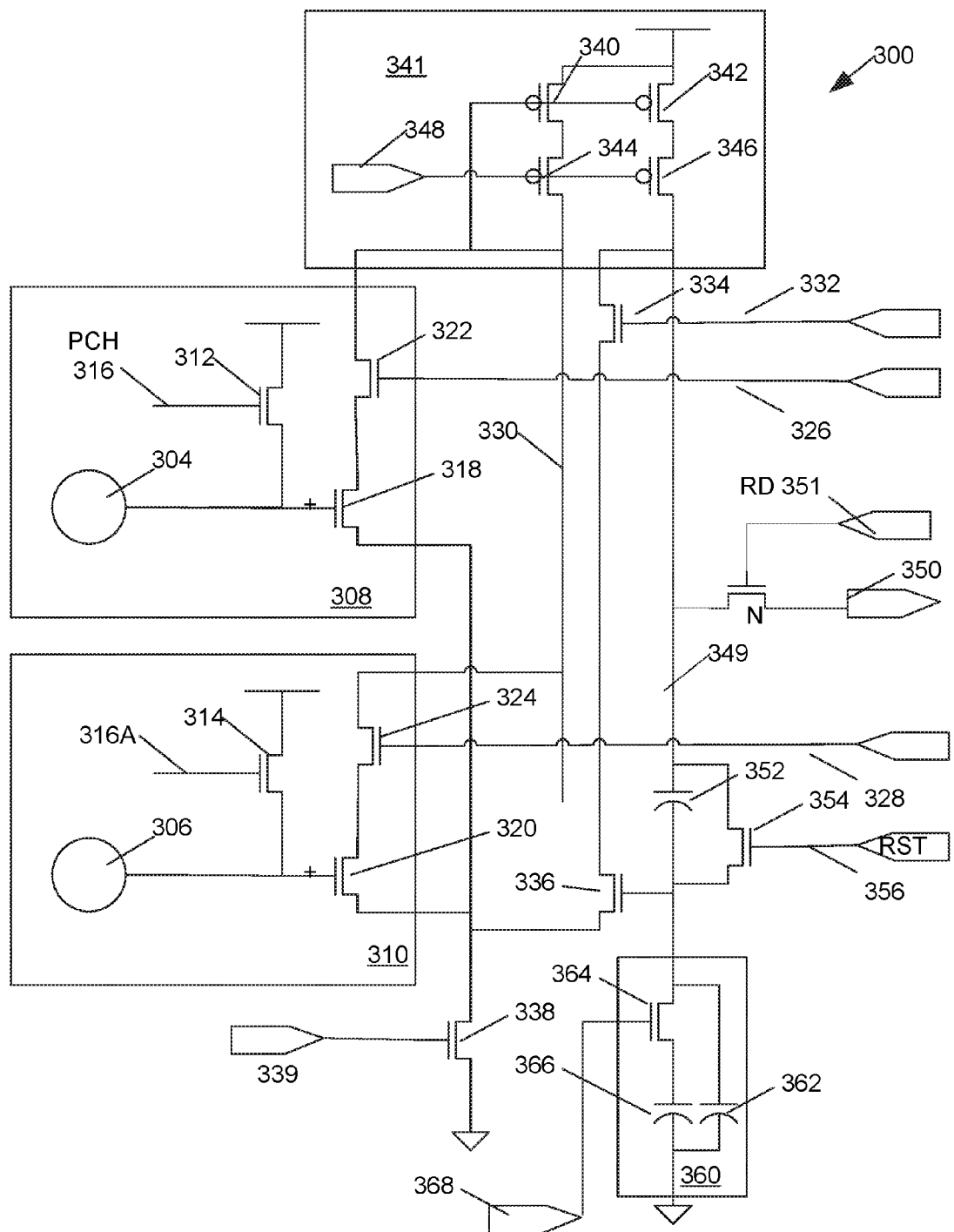
FIG. 3 is a schematic diagram of an alternative embodiment of gain amplification circuitry.
Figure 3A:
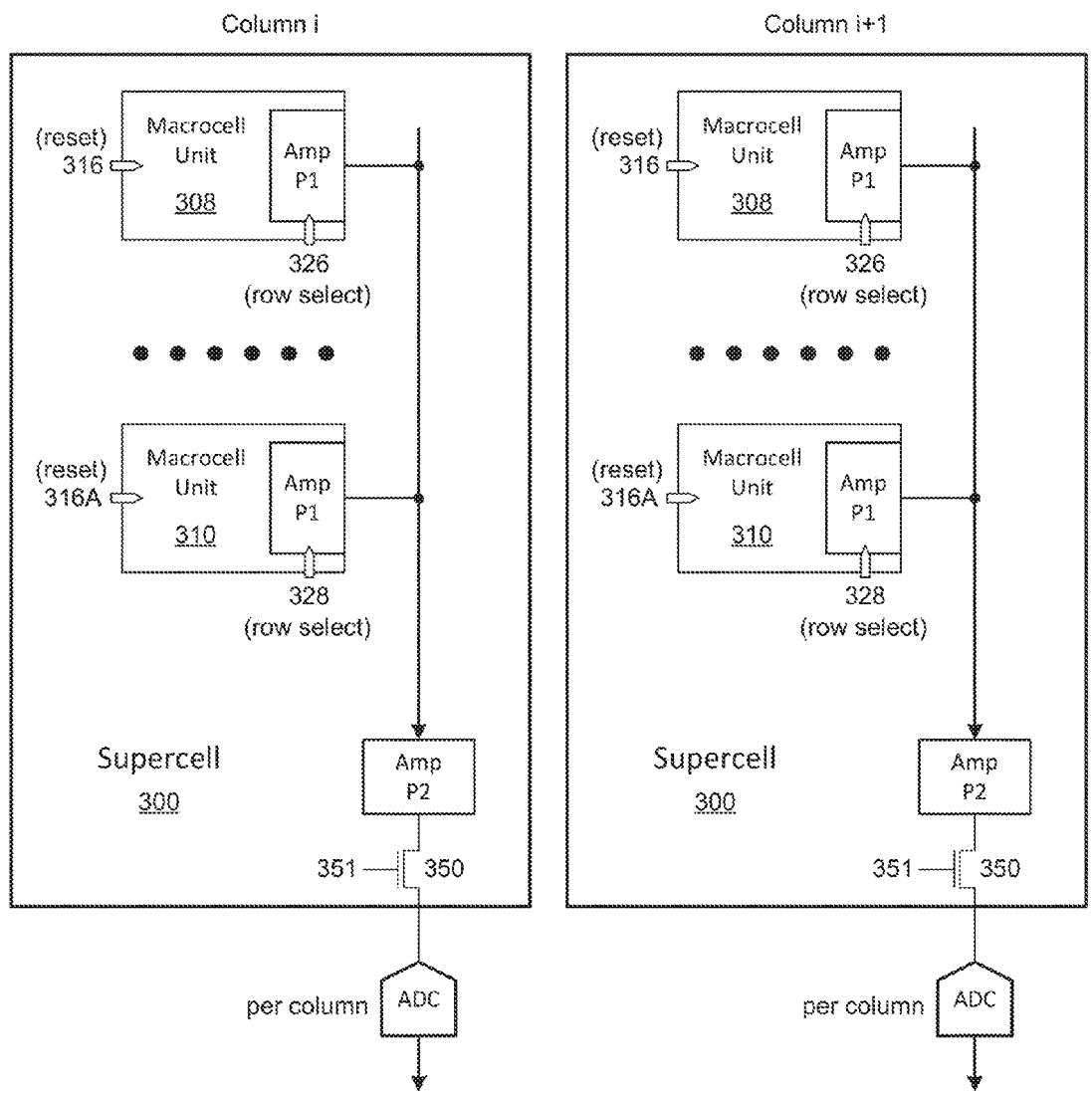
FIG. 3A illustrates an embodiment where each supercell is a column of an image sensor, with amplifier portion P1 in each macrocell unit, and amplifier portion P2 common to all macrocell units of the supercell.

FIG. 3, Shared Amplifier Supercell

In an alternative embodiment of a supercell 300 (FIG. 3), incorporating one or more macrocells, each macrocell of the photodiode die (not shown for simplicity, similar to that of FIG. 2) bonds to a bond contact 304, 306 in a three-transistor macrocell unit 308, 310 of the support circuitry die. Each macrocell unit 308, 310 also has a reset transistor 312, 314 controlled by a reset control line 316, 316A. Typically reset line 316, 316A controls individual row pixel reset. Also within macrocell unit 308, 310 is a differential input transistor 318, 320 having gate connected to bond contact 304, 306, differential input transistor 318, 320 coupled in series with a cascode and selection transistor 322, 324. The amplifier input transistors 318, 320 in macrocell unit 308, 310 are connected to the supercell portion of the amplifier through signal lines 326 and 328. Line 326, 328 serves two functions: as a cascode device to boost system gain and as the row selection transistor, which enable the local amplifier front end 308 or 310 to engage the supercell portion of the amplifier through line 330 and form a cascaded amplifier. Cascode line 330 may couple to additional macrocells, not shown, to operate with different row of sensor pixels.

In particular embodiments, supercell 300 (FIG. 3), 400 (FIG. 4), or 600 (FIG. 6) represents a column of a photodiode array of an image sensor integrated circuit. In the embodiment of FIG. 3, cascode line 330 becomes a column line, in the embodiment of FIG. 4, cascode line 430 becomes a column line, and in the embodiment of FIG. 6, lines 670, 672 represent true and complement column lines of the array.

During read operations of photodiodes coupled to a particular macrocell unit 308, the macrocell selection line 326 of that macrocell unit is driven to a high level matching a level applied through a cascode bias line 332 to a common cascode transistor 334, while all macrocell selection lines 328 of other macrocells 310 in the supercell 300 are driven low to deselect those macrocells The differential input transistor 318 of the selected macrocell 308 thus becomes a noninverting input of a differential amplifier formed of the selected differential input transistor 318, a common inverting differential input transistor 336, and a current source 338 transistor having a gate coupled to a bias voltage 339.

The differential amplifier has a current-mirroring active load 341 formed of complementary load transistors 340, 342 and cascode transistors 344, 346, cascode transistors 344, 346 being biased on by a cascode bias 348; providing an amplifier output 349 roughly corresponding to output 231 of amplifier 230 on FIG. 2.

The differential amplifier output 349 is coupled through a gain-setting feedback capacitor 352 to the gate of inverting differential input transistor 336, and through a reset transistor 354 controlled by an amplifier reset line 356. The gate of inverting differential input transistor 336 also couples to a programmable gain-controlling capacitor assembly 360 having a fixed capacitor 362 and one or more sets of capacitance selection transistors 364 and selectable capacitors 366; effective capacitance of gain-controlling capacitor assembly 360 is controlled by one or more capacitance selection control lines 368. Gain controlling capacitor assembly 360 acts as a variable capacitor coupled between the inverting input of the differential amplifier and ground.

The supercell output 350 is taken directly from amplifier output 349 in some embodiments, and may in some embodiments be taken through a selection transistor controlled by a selection signal 351, and provides signal to column multiplexors and gain amplifiers.

Figure 4:
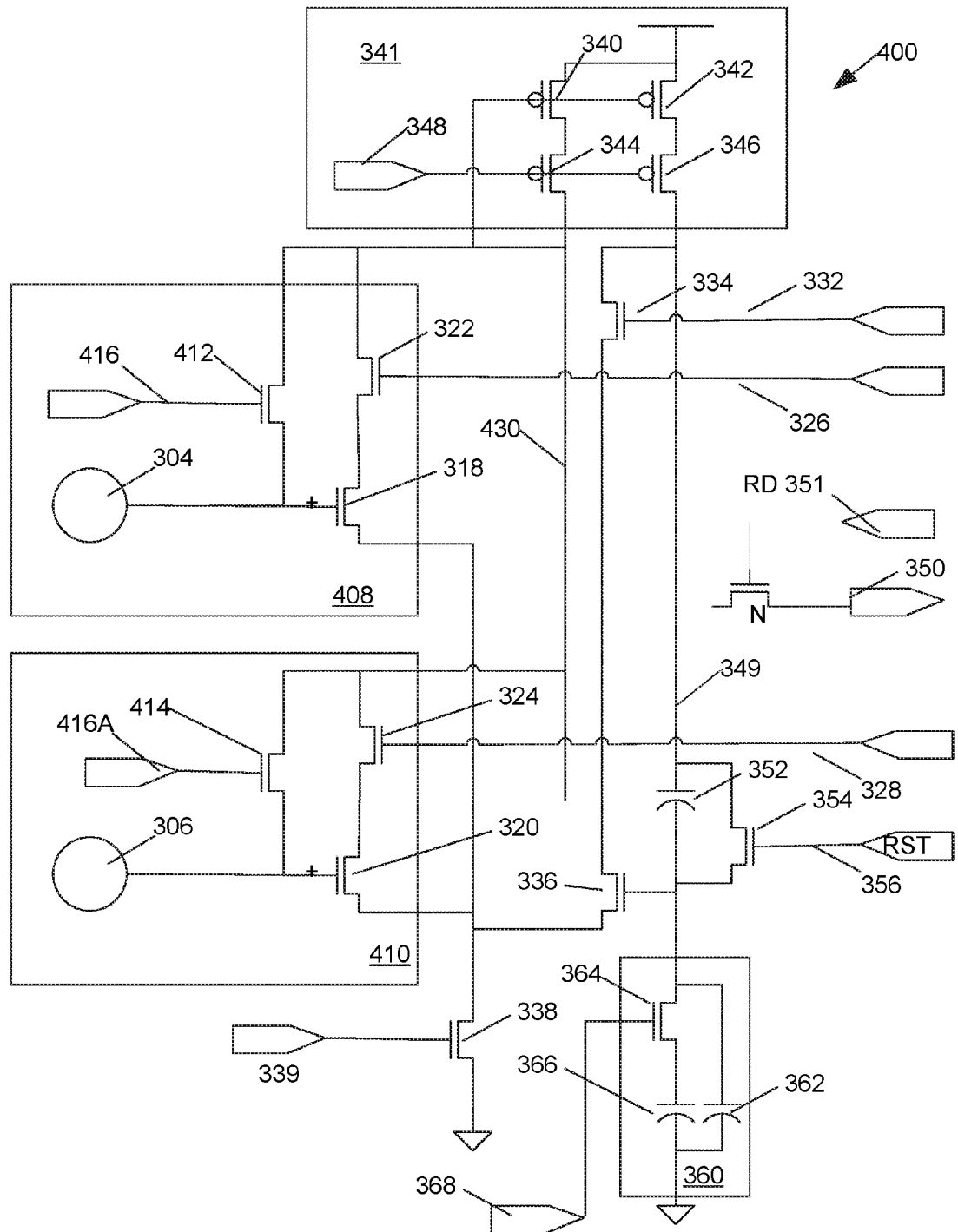
FIG. 4 is a schematic diagram of another alternative embodiment of the gain amplification circuitry.

FIG. 4, Another Supercell

In an alternative embodiment 400 (FIG. 4), resembling but not identical to that of FIG. 3 in order to reduce interconnect attached to each macrocell unit 308, 310, alternate macrocell units 408, 410 are provided, having alternate reset transistors 412, 414. Instead of having drains coupled to a power bus, reset transistors 412, 414 have drains coupled to the common cascode line 430 directly, requiring fewer bus lines feeding into the macrocell units 408, 410 than with the embodiment of FIG. 3. Components of FIG. 4 that have the same numbers as components on FIG. 3 have similar function to that described for the same-numbered component on FIG. 3; in particular differential input transistors 318, 320 act as noninverting inputs of the differential amplifier, and inverting differential input transistor 336 as an inverting input of the differential amplifier.

In the embodiments of FIG. 3 and FIG. 4, macrocell selection lines 326, 328, amplifier reset line 356, gain selection lines 368, current source bias voltage 339, reset line 316, 416, 316A, 416A, and cascode bias lines 348, 332 are provided by decoding, driving, and bias voltage circuitry external to, and typically located adjacent to, the image sensor array.

Timing and Operation of the Embodiment of FIGS. 3 & 4

Figure 5:
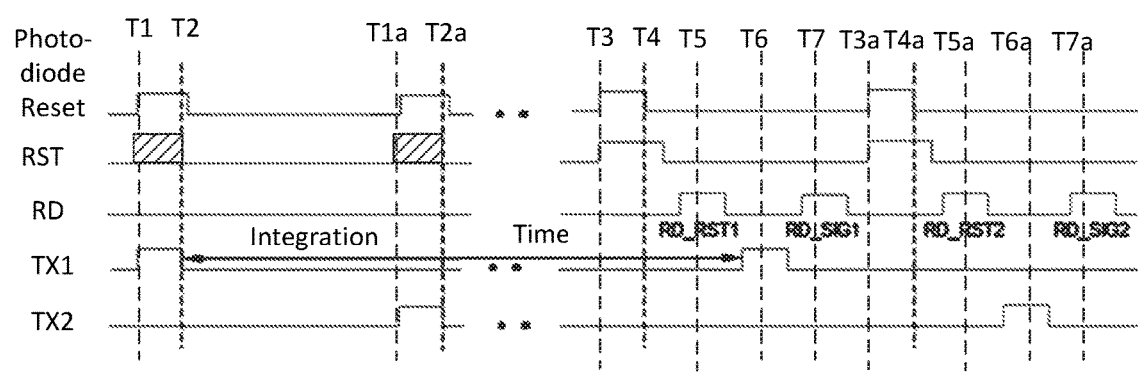
FIG. 5 is a timing diagram illustrating operation of an image sensor having supercells as illustrated in FIG. 3 or 4.

Embodiments according to FIG. 3 or 4 operate according to a sequence as illustrated in FIG. 5, and as further illustrated in FIG. 9. A given macrocell unit, such as 408 (or 410) is selected by applying a high row enable signal 326 (or 328). Prior to reading data, photodiodes are reset 902 at a first time T1, photodiode select lines TX1-TX4 of the associated photodiode die macrocell being driven high in sequence, as is the photodiode reset line 416, 416A of the macrocell having the photodiodes being reset. In embodiments, such as that of FIG. 4, where the reset voltage is an output of a differential amplifier, amplifier reset line RST line 356 is also driven high to couple the output of the amplifier to its input, thereby generating a reference voltage for the reset; the result is placement of an initial voltage on each photodiode of the macrocell and erasure of any stored charge on the photodiode that may remain from previous photocurrent. These control signals are zeroed at a second time T2. The reset process also requires TX(n) to go low before the photodiode reset signal 416 goes low. Photodiode Reset and RST pulses may then repeat, as shown at T1$a$ and T2$a$, for additional TX(n) lines of the array. The array and photodiodes are allowed to remain idle for an exposure delay time 904.

After an exposure delay 904 while the photodiodes are exposed to light, and configuring 906 the differential amplifier for an appropriate gain that in some embodiments may be determined from observing prior images, at time T3 a pulse on photodiode reset 416, 416A, is provided to reset the floating diffusion node, that is, the interconnect by placing a known voltage on the bond 304, 306, interconnect on the supporting circuitry die associated with the bond, interconnect 220 (FIG. 2) of each photodiode-die macrocell; At the same time (T3), the amplifier is reset 908 by driving the amplifier reset RST line 356 high, shorting the amplifier output to the amplifier's inverting input and causing the amplifier's output to return to the reference voltage, tracking the reset signal level at the non-inverting input node 304 of the amplifier. During this operation, since the photodiode transfer and selection lines TX(n) remain low, charge on the photodiodes remains undisturbed.

After the amplifier has stabilized, at time T4, the RST and photodiode reset lines are zeroed at T4 with RST falling slightly after photodiode reset. Next, at a non-overlap delay after time T4, a read-select RD line 234, 351, 645 is pulsed to provide a zero-light or background voltage reading on output bus 236, 350, 644 as a first sample in CDS embodiments; this first sample is sampled in amp, mux, and ADC circuitry 238. A photodiode transfer and selection line such as transfer and selection line TX1 is then activated, as illustrated at T6, to select 910 so as to transfer the signal (charges) from one selected photodiode of the macrocell through the bond to the sense node 304 or 602 in the macrocell unit on the supporting circuitry die and present this signal to the amplifier, and then allowing the amplifier to settle 912. Next, the amplifier is read 914 by pulsing the RD line 234, 351, 645 again, providing onto a bit line, where it is sampled 916 by other circuitry such as an analog-to-digital converter (ADC) 238 at time T7.

The read sequence of time T3-T7 is then repeated, as illustrated at T3A-T7a, for each additional transfer and selection line of the macrocell, such as transfer and selection line TX2, and for the transfer and selection lines associated with other macrocells of the supercell.

In "CDS" embodiments (correlated double sampling), in order to reduce noise, the first sample taken 909 at the other circuitry, such as the ADC, at a time between T3 and T4 before the TX(n) line is pulsed but after the amplifier has settled during amplifier reset; the voltage sampled as the first sample is stored and subtracted 918 from the second sample voltage at time T7, to reduce noise.

The sample at time T7, or the difference between T7 and T5 samples in CDS embodiments, is then subjected to further processing such as being digitized 920.

Figure 6:
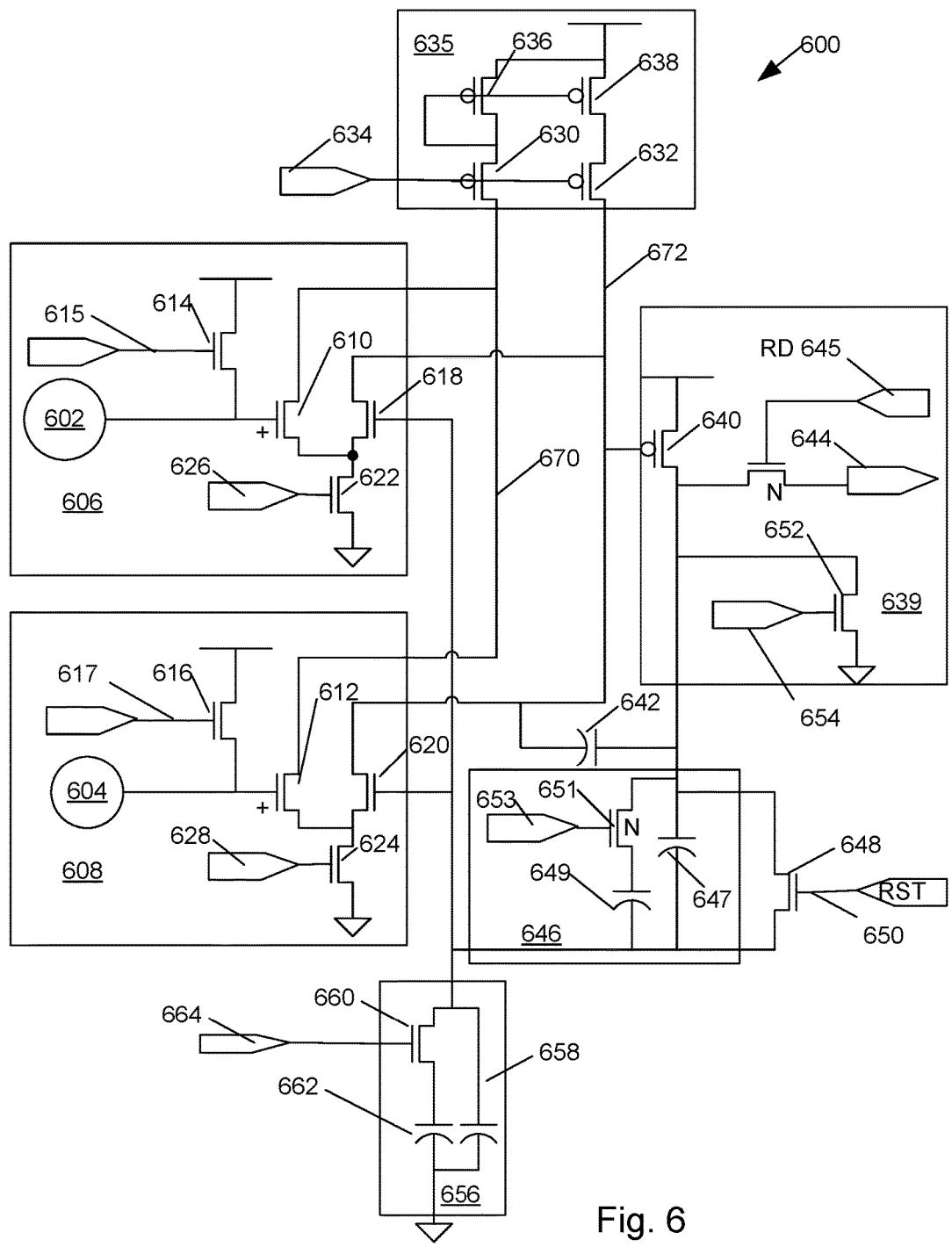
FIG. 6 is a schematic diagram of another alternative embodiment of the gain amplification circuitry, using a two-stage, compensated, amplifier.

FIG. 6, Another Supercell with Two-Stage Gain

The amplifier illustrated in FIGS. 3 and 4 is not the only amplifier useful in image sensors.

In an alternative embodiment 600 (FIG. 6), having a two-stage distributed differential amplifier in each supercell of the supporting circuitry die, macrocells of the photodiode die couple through bonds to bond contacts 602, 604 of macrocell circuits 606, 608 of the supporting circuitry die, where they couple to gates of selectable noninverting input transistors 610, 612 of a differential pair. Each macrocell circuit 606, 608 has a reset transistor 614, 616, driven by a reset line 615, 617, coupled to drive the bond contact 602, 604 and adapted to provide charge for resetting the photodiodes. Each macrocell circuit 606, 608 also has an inverting input transistor 618, 620 of the differential pair, and a current source and selection transistor 622, 624 configured to provide a current to the differential pair. Each current source and selection transistor 622, 624 has gate connected to a separate bias and selection line 626, 628.

Drains of all noninverting input transistors 610, 612 of the supercell are tied together to an active load 635 formed of cascode transistors 630, 632 having gates biased with a cascode bias line 634 and current-mirror devices 636, 638. Similarly, drains of inverting input transistors 618, 620 are tied together and to an opposite side of the active load. The drain of inverting input transistors 618, 620 are also coupled to a gate of a second gain stage amplifier 639 including second stage gain transistor 640 and to a compensation capacitor 642. Second gain stage transistor 640 has drain providing an output 644 of the two-stage compensated differential amplifier. Compensation capacitor 642 couples to amplifier output 644. A first gain setting capacitor 646 and amplifier reset transistor 648 connect between amplifier output 644 and gates of noninverting input transistors 618, 620 of all macrocell circuits 606, 608 of the supercell. In an embodiment, as illustrated in FIG. 6, gain setting capacitor 646 is adjustable, including a fixed capacitor 647, and one or more selectable capacitors 649 each coupled through a capacitance control transistor 651 operating under control of a gain control line 653. Amplifier reset transistor 648 operates under control of an amplifier reset line RST 650. A current source transistor 652 provides a load for second gain stage transistor 640, operating under control of a bias signal 654. A variable-capacitance gain-adjustment capacitor assembly 656 is also coupled to the inverting inputs of the differential amplifiers, this has a fixed capacitance 658, one or more selection transistors 660, and one or more selectable capacitors 662; the section transistors of the gain adjustment capacitor assembly 656 operate under control of one or more gain control lines 664.

The amplifier of FIG. 6 is operable in a double-sampling mode as described above.

Control lines, such as bias and selection lines 626, 628, cascode bias line 634, gain control lines 664, bias signal 654, and amplifier reset signal 650 are provided by decoding, driving, and bias voltage circuitry external to, and typically located adjacent to, the image sensor array.

Figure 7:
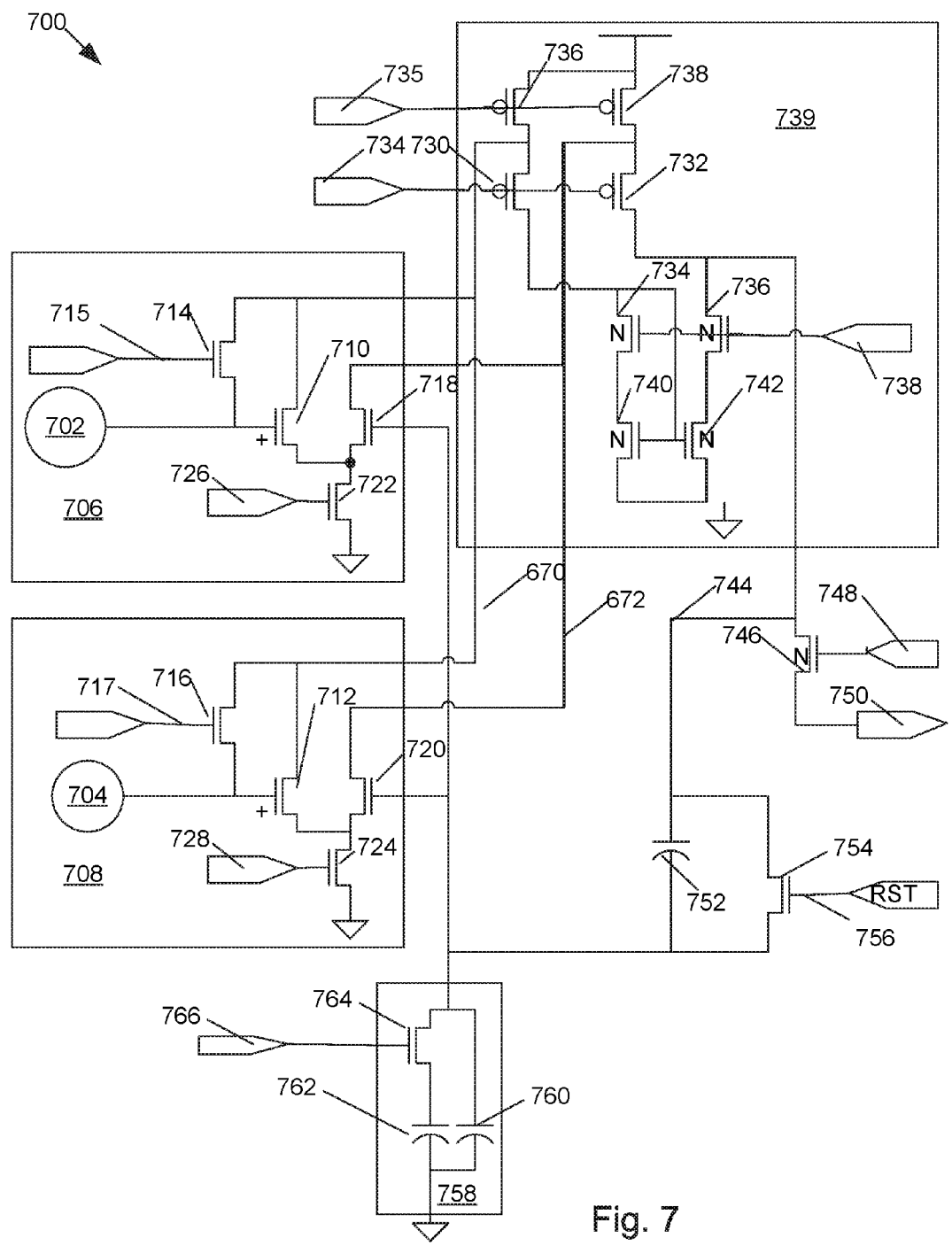
FIG. 7 is a schematic diagram of another alternative embodiment of the amplification circuitry, using a folded-cascode amplifier.

FIG. 7, Folded Cascode Embodiment

In an alternative embodiment 700 (FIG. 7), having a distributed differential amplifier in each supercell of the supporting circuitry die with a folded cascode load, macrocells of the photodiode die couple through bonds to bond contact 702, 704 of macrocell circuits 706, 708 of the supporting circuitry die, where they couple to gates of selectable noninverting input transistors 710, 712 of a differential pair. Each macrocell circuit 706, 708 has a reset transistor 714, 716, controlled by a reset line 715, 717, coupled to drive the bond contact 702, 704 and adapted to provide charge for resetting the photodiodes. Each macrocell circuit 706, 708 also has an inverting input transistor 718, 720 of the differential pair, and a current source and selection transistor 722, 724 configured to provide a current to the differential pair. Each current source and selection transistor 722, 724 has gate connected to a separate current source bias and selection line 726, 728. This selection enables circuitry of local macrocell units 706 or 708 to merge with the global circuitry and form a complete amplifier. As an alternative, the drain side of NMOS 714 and 716 can also be connected to a dedicated power signal line for resetting the photodiode.

Drains of all noninverting input transistors 710, 712 of the supercell are tied together to an active load and amplifier 739 in folded-cascode form that is formed of cascode transistors 730, 732 having gates biased with cascode bias lines 734, 735 and cascode current devices 736, 738. Similarly, drains of inverting input transistors 718, 720 are tied together and to an opposite side cascode current device 738 of the active load portion of load and amplifier 739. Outputs of cascode transistor 730, 732 couple to cascode transistors 734, 736 operating under control of a gate voltage 738 and cascode transistors 732, 730 couple to current source transistors 740, 742. The active load and amplifier 739 provides a raw output 744. A read-selection transistor 746 operating under control of a read RD line 748 are provided to couple raw output 744 to an output line 750.

A first gain setting capacitor 752, which may be a configurable capacitance capacitor operating under control of gain-control lines (not shown) and amplifier reset transistor 754 connect between noninverting amplifier output 750 and gates of inverting input transistors 718, 720 of all macrocell circuits 706, 708 of the supercell. Amplifier reset transistor 754 operates under control of an amplifier reset line RST 756. A fixed or in most embodiments a variable-capacitance gain-adjustment capacitor assembly 758 is also coupled to the inverting inputs of the differential amplifiers, this has a fixed capacitance 760, one or more selection transistors 764, and one or more selectable capacitors 762; the section transistors of the gain adjustment capacitor assembly 758 operate under control of one or more gain control lines 766.

The amplifier of FIG. 7 is operable in a double-sampling mode as described above.

Control lines, such as bias and selection lines 726, 728, cascode bias lines 734, 738, gain control lines 766, and amplifier reset signal 756 are provided by decoding, driving, and bias voltage circuitry external to, and typically located adjacent to, the image sensor array.

Figure 8:
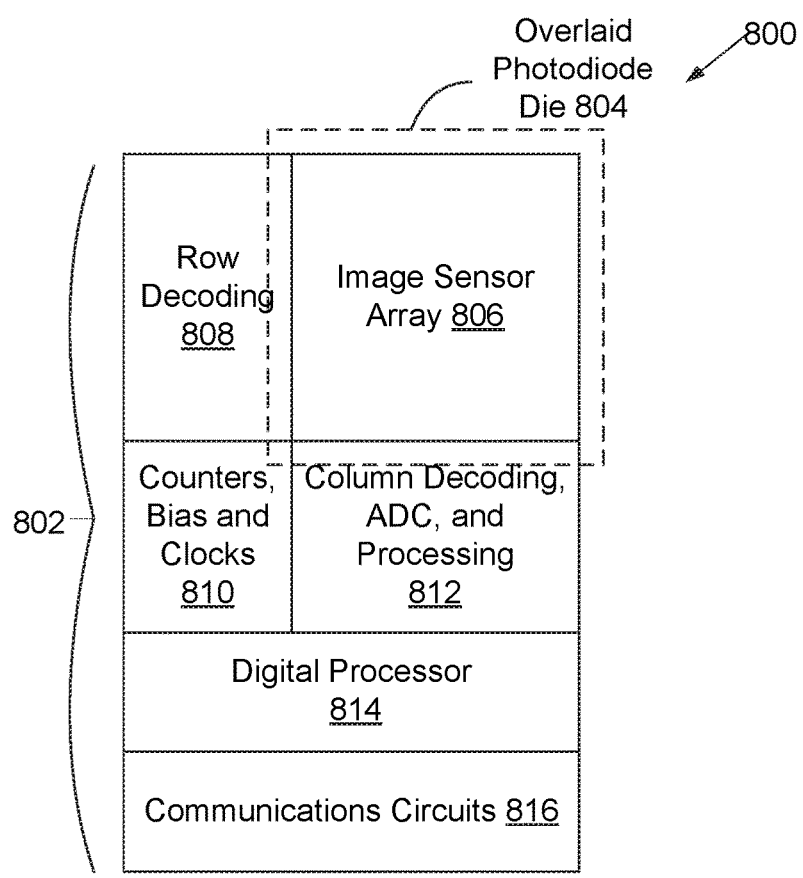
FIG. 8 is a block diagram of a system incorporating an image sensor according to an embodiment.

FIG. 8, an Integrated Camera

An integrated camera 800 (FIG. 8) has a supporting circuitry die 802 with a backside-illuminated photodiode die 804 bonded to it. The supporting circuitry die has supercell supporting circuitry as described in accordance with FIG. 2, 3, 4 or 6 acting in concert with the photodiode die 804 as an image sensor array 806. The image sensor array 806 is driven by row decoders 808, which in an embodiment include a macrocell photodiode-selection decoder for driving photodiode transfer and selection lines such as TX1-TX4 of FIG. 2 and a supercell selection decoder for driving supercell selection lines such as 234 of FIG. 2 operating under control of counters, bias, and clock circuits 810, and sensed image data is processed by column sensing, ADC, and processing circuits 812 to provide a digital image. The digital image is compressed by digital processor 814 and communicated to a host system by communications circuits 816.

While each of FIG. 3, FIG. 4, and FIG. 6 illustrate two macrocell circuits, it is intended that other numbers of macrocell circuits may be provided within each supercell of the supporting circuitry die; in particular it is likely an entire column of macrocell circuits may be used in supercells of particular embodiments.

Combinations

Features described herein may be present in different combinations within a single camera system. Among combinations of features anticipated are hybrid bonded image array integrated circuits embodying combinations of any one of the three-transistor support-circuitry macrocells 308 (FIG. 3), 408 (FIG. 4) or four-transistor support-circuitry macrocells 606 (FIG. 6), 706 (FIG. 7) herein illustrated may be combined with either one of the current-sourcing active loads 341 (FIG. 3), 635 (FIG. 6) illustrated and used with or without second stage amplifier 639. Similarly, combinations of features anticipated include hybrid bonded image array integrated circuits with a combination of any one of the three-transistor support-circuitry macrocells 308 (FIG. 3), 408 (FIG. 4) or four-transistor support-circuitry macrocells 606 (FIG. 6), 706 (FIG. 7) herein illustrated with the folded-cascode load-amplifier 739 of FIG. 7, used with or without second stage amplifier 639. Further, it is anticipated that second stage amplifier 639 may receive input from either side of the differential amplifier. It is also anticipated that embodiments using all three and four-transistor support-circuitry macrocells 308 (FIG. 3), 408 (FIG. 4), 606 (FIG. 6), 706 (FIG. 7) herein illustrated; with either one of the current-sourcing active loads 341 (FIG. 3), 635 (FIG. 6) or the folded-cascode load-amplifier 739 of FIG. 7, used with or without second stage amplifier 639, may be used with fixed (352 FIG. 3) or configurable (646 FIG. 6) gain-setting capacitors coupled between differential amplifier output and the inverting input of the differential amplifier, and may be used with fixed (not shown) or configurable (360 FIG. 43 &, 656 FIG. 6) gain-setting capacitors coupled between differential amplifier inverting input and signal ground.

Additional combinations anticipated include:

A hybrid bonded image sensor designated A including a photodiode die with multiple macrocells, where each macrocell has at least one photodiode and a bond contact; and a supporting circuitry die having multiple supercells, each supercell with at least one macrocell unit, each macrocell unit having at least one bond contact bonded to the bond contact of a macrocell of the photodiode die and a reset transistor adapted to provide a reset to photodiodes of the macrocell of the photodiode die. Each supercell also has a differential amplifier configurable to receive a noninverting input from a photodiode and an inverting input, the differential amplifier adapted to provide a differential amplifier output; the amplifier has an amplifier reset transistor coupled to the differential amplifier output and the inverting input; a first capacitor coupled between the differential amplifier output and the inverting input, and a second capacitor coupled between the inverting input and a signal ground.

A hybrid bonded image sensor designated AA including the image sensor designated A wherein each photodiode die macrocell has two, four, or eight photodiodes each coupled through a selection transistor to the bond contact.

A hybrid bonded image sensor designated AAA including the image sensor designated A or AA wherein each supercell is configured to sense all photodiodes of a column of the hybrid bonded image sensor.

A hybrid bonded image sensor designated AB including the image sensor designated A, AA, or AAA wherein each supercell has multiple macrocell units, and the differential amplifier is a distributed differential amplifier configured with a noninverting input transistor in each macrocell unit.

A hybrid bonded image sensor designated AC including the hybrid bonded image sensor designated A, AA, AAA, or AB wherein the second capacitor comprises a variable capacitance assembly comprising at least one capacitance selection transistor coupled in series with a capacitor.

A hybrid bonded image sensor designated AD including the hybrid bonded image sensor designated A, AA, AAA, or AB wherein the first capacitor comprises a variable capacitance assembly comprising at least one capacitance selection transistor coupled in series with a capacitor.

A hybrid bonded image sensor designated AE including the hybrid bonded image sensor designated A, AA, AAA, AB, AC, or AD hybrid bonded image sensor of claim 3 wherein the first capacitor comprises a variable capacitance assembly comprising at least one capacitance selection transistor coupled in series with a capacitor.

A hybrid bonded image sensor designated AF including the hybrid bonded image sensor designated A, AA, AAA, AB, AC, AD, or AE wherein the differential amplifier has a folded-cascode load-amplifier.

A hybrid bonded image sensor designated AG including the hybrid bonded image sensor designated A, AA, AAA, AB, AC, AD, or AE wherein the differential amplifier is a single-stage amplifier.

A hybrid bonded image sensor designated AH including the hybrid bonded image sensor designated A, AA, AAA, AB, AC, AD, or AE wherein the differential amplifier is a two-stage amplifier.

A camera system designated AJ incorporating the hybrid bonded image sensor designated AE including the image sensor designated A, AA, AAA, AB, AC, AD, AE, AF, AG, or AH, the image sensor including at least one decoder coupled to drive photodiode transfer and selection lines of macrocells of the array, to supercell select lines, and column select lines, the camera system also having an analog-to-digital converter coupled to receive data from the image sensor, at least one counter coupled to the at least one decoder, and a digital processor coupled to receive data from the analog-to-digital convertor. The image sensor analog-to-digital convertor, counter, and digital processor are formed in the supporting circuitry die; and the photodiode die is configured for backside illumination.

A method designated B of forming digitized pixel data using a photodiode die configured with a supporting circuitry die such that 1, 2, 4, or 8 photodiodes of the photodiode die each couple through a selection transistor to a bond, the bond coupling to a macrocell of the supporting circuitry die, includes: precharging a photodiode of the photodiode die; exposing the photodiode to light; configuring a gain of the differential amplifier by setting a capacitance of an selectable-capacitance gain control circuit and resetting the amplifier; coupling a signal from the photodiode of the photodiode die through the bond to the macrocell circuit of the supporting circuitry die, the macrocell circuit including at least a noninverting input transistor of a differential amplifier; amplifying, using the differential amplifier, the signal from the photodiode of the photodiode die; coupling a signal from the differential amplifier to an analog-to-digital converter; and forming digitized pixel data by steps including digitizing the signal in the analog-to-digital convertor.

A method designated BA including the method designated B wherein the photodiode die comprises photodiode-die macrocells each having a plurality of photodiodes each coupled through a selection transistor to the bond.

A method designated BB including the method designated B or BA wherein the differential amplifier forms part of a supercell coupled to a plurality of photodiode-die macrocells, and where the differential amplifier is a distributed differential amplifier configured with a noninverting input transistor associated with each photodiode-die macrocell.

A method designated BC including the method designated B, BA, or BB wherein the supercell corresponds to a column of the image sensor array.

A method designated BD including the method designated B, BA, BB, or BC, wherein the bit line is sampled twice for each signal, with a first sample being subtracted from a second sample prior to digitizing the second sample.

CONCLUSIONS

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A hybrid bonded image sensor comprising:
    a photodiode die comprising a plurality of macrocells, where each macrocell comprises at least one photodiode and a connection point;
    a supporting circuitry die comprising a plurality of supercells, each supercell comprising at least one macrocell unit, each macrocell unit comprising at least one connection point bonded to the connection point of a macrocell of the photodiode die and a reset transistor adapted to reset photodiodes of the macrocell of the photodiode die; and
    each supercell comprising:
        a differential amplifier configurable to receive a noninverting input from a photodiode and an inverting input, the differential amplifier adapted to provide a differential amplifier output,
        an amplifier reset transistor coupled to the differential amplifier output and the inverting input, and
        a first capacitor coupled between the differential amplifier output and the inverting input, and a second capacitor coupled between the inverting input and a signal ground.

2. The hybrid bonded image sensor of claim 1 wherein each photodiode die macrocell comprises two, four, eight, or sixteen photodiodes each coupled through a transfer and selection transistor to the connection point.

3. The hybrid bonded image sensor of claim 2 wherein each supercell is configured to sense all photodiodes of a column of the hybrid bonded image sensor.

4. The hybrid bonded image sensor of claim 1 wherein each supercell comprises a plurality of macrocell units, and where the differential amplifier of each supercell is a distributed differential amplifier configured with a noninverting input transistor in each macrocell unit.

5. The hybrid bonded image sensor of claim 3 wherein the second capacitor comprises a variable capacitance assembly comprising at least one capacitance selection transistor coupled in series with a capacitor.

6. The hybrid bonded image sensor of claim 3 wherein the first capacitor comprises a variable capacitance assembly comprising at least one capacitance selection transistor coupled in series with a capacitor.

7. The hybrid bonded image sensor of claim 3 wherein the differential amplifier has a folded-cascode load-amplifier.

8. The hybrid bonded image sensor of claim 3 wherein the differential amplifier is a single-stage amplifier.

9. The hybrid bonded image sensor of claim 3 wherein the differential amplifier is a two-stage amplifier.

10. A camera system incorporating the hybrid bonded image sensor of claim 3, the image sensor further comprising at least one decoder coupled to drive photodiode select lines of macrocells of the photodiode die, and to drive supercell select lines, the camera system further comprising:
    an analog-to-digital converter coupled to receive data from the image sensor,
    at least one counter coupled to the at least one decoder, and
    a digital processor coupled to receive data from the analog-to-digital converter;
    wherein the analog-to-digital converter, counter, and digital processor are formed in the supporting circuitry die; and
    wherein the photodiode die is configured for backside illumination.

11. A method of forming digitized pixel data using a photodiode die configured with a supporting circuitry die such that 1, 2, 4, or 8 photodiodes of the photodiode die each couple through a transfer and selection transistor to a bond, the bond coupling to a macrocell of the supporting circuitry die comprising:

resetting a photodiode of the photodiode die;

exposing the photodiode to light;

configuring a gain of a differential amplifier by setting a capacitance of a selectable-capacitance gain control circuit coupled to provide feedback to an inverting input of the differential amplifier, and resetting the differential amplifier;

coupling a signal from the photodiode of the photodiode die through the bond to the macrocell circuit of the supporting circuitry die, the macrocell circuit comprising at least a noninverting input transistor of the differential amplifier;

amplifying, using the differential amplifier, the signal from the photodiode of the photodiode die;

coupling a signal from the differential amplifier to an analog-to-digital converter; and forming digitized pixel data by steps comprising digitizing the signal in the analog-to-digital convertor.

12. The method of claim 11 wherein the photodiode die comprises photodiode-die macrocells each comprising a plurality of photodiodes each coupled through a selection transistor to the bond.

13. The method of claim 12 wherein the differential amplifier forms part of a supercell coupled to a plurality of photodiode-die macrocells, and where the differential amplifier is a distributed differential amplifier configured with a noninverting input transistor associated with each photodiode-die macrocell.

14. The method of claim 12 wherein the supercell corresponds to a column of the image sensor array.

15. The method of claim 12, wherein the bit line is sampled twice for each photodiode read, with a first sample taken with inactive photodiode select lines being subtracted from a second sample taken with an active photodiode select line prior to digitizing the second sample.

* * * * *